(12) United States Patent
Chuang et al.

(10) Patent No.: US 8,314,471 B2
(45) Date of Patent: Nov. 20, 2012

(54) TRENCH DEVICES HAVING IMPROVED BREAKDOWN VOLTAGES AND METHOD FOR MANUFACTURING SAME

(75) Inventors: Chiao-Shun Chuang, Kaohsiung (TW); Tony Huang, Plano, TX (US)

(73) Assignee: Diodes Incorporated, Plano, TX (US)

( * ) Notice: Subject to any disclaimer, the term of this patent is extended or adjusted under 35 U.S.C. 154(b) by 55 days.

(21) Appl. No.: 12/620,473

(22) Filed: Nov. 17, 2009

(65) Prior Publication Data
US 2011/0115015 A1     May 19, 2011

(51) Int. Cl.
*H01L 29/02* (2006.01)

(52) U.S. Cl. ............... 257/488; 257/496; 257/E29.009; 257/E29.011; 257/330; 257/334; 257/E21.41; 257/E29.262; 257/E21.655; 438/270; 438/259

(58) Field of Classification Search ............ None
See application file for complete search history.

(56) References Cited

U.S. PATENT DOCUMENTS

| | | | |
|---|---|---|---|
| 6,433,385 B1 | 8/2002 | Kocon et al. | |
| 2002/0061623 A1* | 5/2002 | Hshieh et al. | 438/268 |
| 2003/0020134 A1* | 1/2003 | Werner et al. | 257/471 |
| 2004/0089910 A1 | 5/2004 | Hirler et al. | |
| 2007/0194374 A1* | 8/2007 | Bhalla et al. | 257/330 |
| 2010/0264486 A1* | 10/2010 | Denison et al. | 257/330 |
| 2011/0049526 A1* | 3/2011 | Chu et al. | 257/76 |

* cited by examiner

*Primary Examiner* — Fei Fei Yeung Lopez

(57) ABSTRACT

In one embodiment, the present invention includes a semiconductor power device. The semiconductor power device comprises a trenched gate and a trenched field region. The trenched gate is disposed vertically within a trench in a semiconductor substrate. The trenched field region is disposed vertically within the trench and below the trenched gate. A lower portion of the trenched field region tapers to disperse an electric field.

16 Claims, 8 Drawing Sheets

TRENCH DEVICES HAVING IMPROVED BREAKDOWN VOLTAGES AND METHOD FOR MANUFACTURING SAME

BACKGROUND

The present invention relates to improved breakdown voltages in trench devices, and in particular, to trench devices having improved breakdown voltages and method for manufacturing same.

Unless otherwise indicated herein, the approaches described in this section are not prior art to the claims in this application and are not admitted to be prior art by inclusion in this section.

Some semiconductor power devices use trenching to produce metal-oxide-semiconductor (MOS) devices that increase efficiency. For example, rectifiers may be comprised of an array of diodes. Each diode has a PN junction which may dissipate power due to the turn on voltage of the PN junction. This turn on voltage of about 0.6V may be reduced by a trenched MOS gate fabricated vertically within a trench to form a vertical MOS device within the semiconductor. The MOS device may turn on at a few tenths of a volt, and thereby reduce the voltage drop across the PN junction. This, in turn, reduces the power dissipation associated with that voltage drop. The rectifier turns off when a reverse voltage is placed across its terminals.

When the rectifier is biased with a reverse voltage, no significant current flows. In some applications the rectifier may experience transient reverse voltages over 70V, and the ability for the rectifier to withstand such transient voltages without breaking down is a measure of reliability. The breakdown voltage of a rectifier using trenched gates may be defined by the trenched MOS gate structure.

The trenched MOS gate is insulated from the cathode region of the diode by a dielectric. During the reverse bias voltage condition, a voltage V forms across this dielectric. In this case, the trenched gate dielectric may have a voltage breakdown that is lower than the breakdown of the PN junctions of the diodes themselves. This premature breakdown may limit the operational voltages which may be used with the rectifier or may cause reliability problems.

Thus, there is a need for improved breakdown voltages in trench devices. The present invention solves these and other problems by providing trench devices having improved breakdown voltages and method for manufacturing same.

SUMMARY

Embodiments of the present invention improves breakdown voltages in trench devices. In one embodiment, the present invention includes a semiconductor device comprising a trenched gate disposed vertically within a trench in a semiconductor substrate and a trenched field region disposed vertically within said trench and below said trenched gate, wherein a lower portion of said trenched field region tapers to disperse an electric field.

In one embodiment, the trenched field region includes a dielectric layer within said lower portion, and wherein said dielectric layer conforms to opposing concave surfaces of said trench which meet at a bottom of said trench field region.

In one embodiment, said lower portion forms a triangular shape, and wherein a bottom of said triangular shape forms an acute angle.

In one embodiment, said lower portion includes a vertical elongated region at a bottom of said lower portion, wherein said vertical elongated region extends said lower portion to further disperse said electric field, and wherein said vertical elongated region has a width that is less than half the width of a widest portion of said trenched field region.

In one embodiment, said trenched field region includes a first material and a dielectric layer, wherein the dielectric layer is between said semiconductor substrate and said first material, wherein said dielectric layer is on the sidewalls of said trench.

In one embodiment, said first material forms an angle at a bottom of said first material that is greater than an angle formed at a bottom of said trench.

In one embodiment, said dielectric layer has a thickness at a bottom of said lower portion greater than the thickness of the dielectric layer at other portions of said trench.

In another embodiment, the present invention includes a method of manufacturing a semiconductor power device comprising etching a trench in a semiconductor substrate, the trench including a lower portion that tapers, growing a dielectric layer in the trench, wherein the dielectric layer includes a taper conforming to the taper in the lower portion of the trench, and forming a vertical MOSFET on a sidewall of the trench above the lower portion.

In one embodiment, forming the vertical MOSFET comprises removing the dielectric layer above the lower portion of the trench and growing a gate oxide on the sidewalls of the trench.

In one embodiment, forming the vertical MOSFET comprises depositing polysilicon in a portion of the trench above the lower portion.

In one embodiment, forming the vertical MOSFET comprises implanting a dopant in the substrate at a top of said trench.

In one embodiment, the method further comprises depositing a first material in the lower portion of the trench, wherein the dielectric layer is between the first material and the sidewall of the trench, and wherein the dielectric layer has a first thickness that increases toward a bottom of the trench.

In one embodiment, the method further comprises removing a first portion of said dielectric layer in an area above said lower portion and below a top of said first material, removing a portion of said first material such that a depth of said top of said first material is reduced to a first level, removing a second portion of said dielectric layer such that a depth of a top of said dielectric layer is reduced to a second level, and adding a second dielectric layer covering said top of said first material and said top of said dielectric layer.

In one embodiment, said dielectric layer conforms to opposing concave surfaces of said trench that meet at a bottom of said trench.

In one embodiment, said lower portion forms a triangular shape, and wherein a bottom of said triangular shape forms an acute angle.

In one embodiment, etching said trench includes etching a vertical elongated region at a bottom of said lower portion, In one embodiment, said vertical elongated region extends said lower portion to further disperse said electric field, and wherein said vertical elongated region has a width that is less than half the width of a widest portion of said trenched field region.

In another embodiment, the present invention includes an integrated circuit comprising a plurality of diodes coupled in parallel, each diode of said plurality of diodes comprising, a trenched gate disposed vertically within a trench in a semiconductor substrate, and a trenched field region disposed vertically within said trench and below said trenched gate, wherein a lower portion of said trenched field region tapers to disperse an electric field.

In one embodiment, a reduced thickness of an epitaxial layer of the semiconductor substrate is used that reduces the breakdown voltage improvement achieved from the trench field region.

In another embodiment, the plurality of diodes are spaced to improve $R_{DSon}$.

In yet another embodiment, the plurality of diodes are spaced to improve integration.

The following detailed description and accompanying drawings provide a better understanding of the nature and advantages of the present invention.

DETAILED DESCRIPTION

Described herein are techniques for improving breakdown voltages in trench devices. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1A:
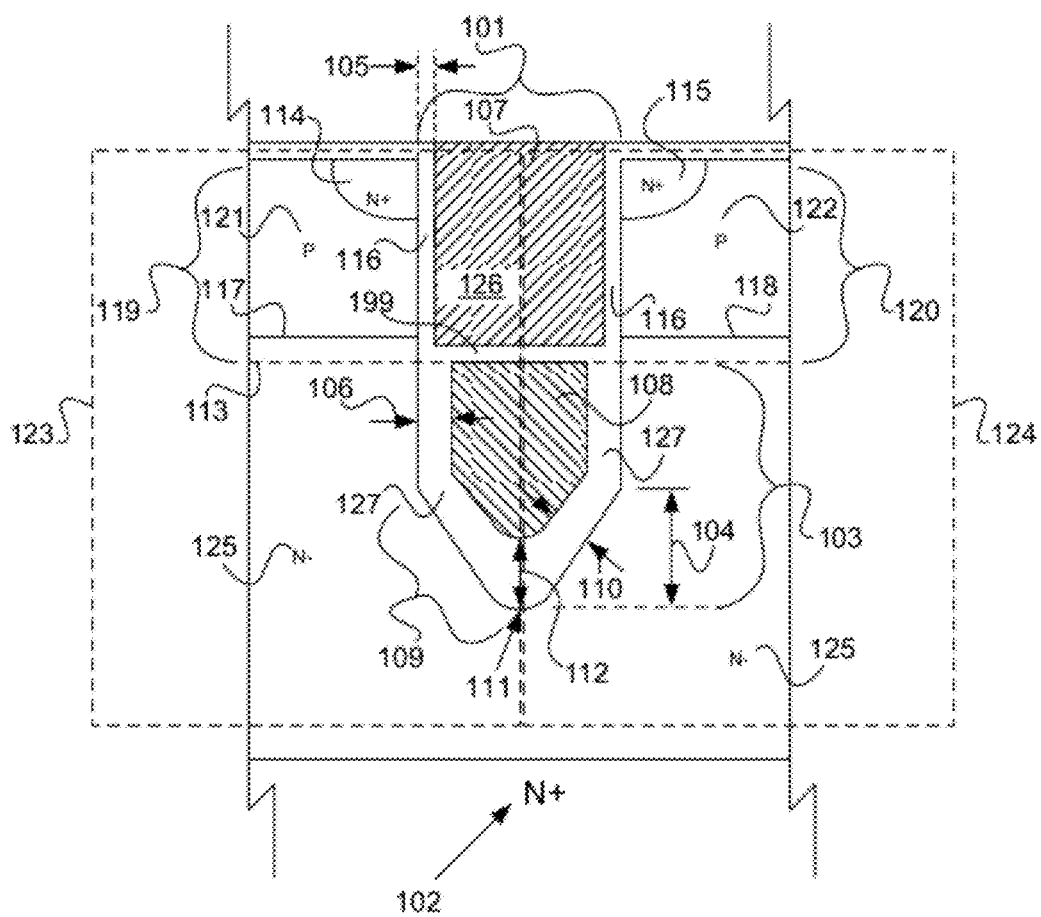
FIG. 1A-1B illustrate a semiconductor power device according to one embodiment of the present invention.
Figure 1B:
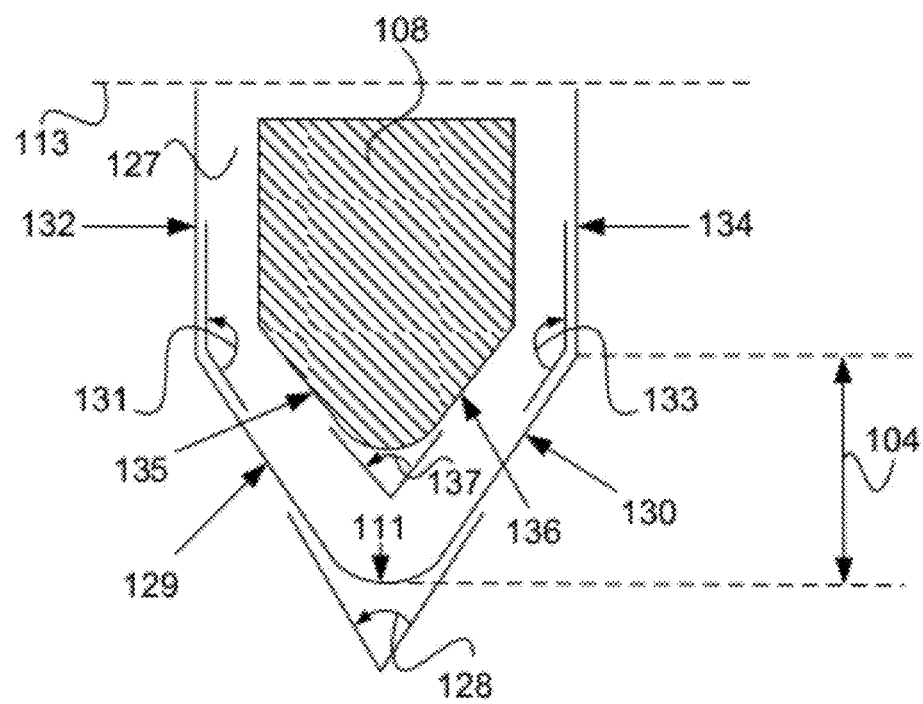

FIG. 1A-B illustrates a semiconductor power device 100 according to one embodiment of the present invention. Semiconductor power device 100 includes diode 123, diode 124, and trench 101. Diode 123 includes PN junction 117 between P region 121 and N– region 125. Diode 124 includes PN junction 118 between P region 122 and N– region 125. Trench 101 includes a trenched gate 126 and a trench field region 103. Trench 101 is disposed vertically into the semiconductor substrate. The semiconductor substrate may include P regions 121-122, N– region 125, and N+ region 102.

Trenched gate 126 is part of vertical N-MOSFETs (n-channel MOS field effect transistors) 119 and 120 within the structure for diodes 123 and 124 (respectively). Trenched gate 126 includes a dielectric layer 116 on both sides of the trench and conductive material 107. Dielectric layer 116 may have width 105 which may be designed to set the threshold voltage of N-MOSFETs 119 and 120. N-MOSFET 119 includes N+ region 114, P region 121, N region 125, and trenched gate 126. N-MOSFET 120 includes N+ region 115, P region 122, N region 125, and trenched gate 126. N-MOSFETs 119 and 120 may reduce the on voltage of diodes 123 and 124 (respectively).

A trenched field region 103 extends vertically below the trenched gate 126. Trench 101 is vertical and substantially parallel in the region of N-MOSFETs 119 and 120 and in trenched field region 103 below the N-MOSFETs. At a lower portion 104, trench 101 tapers. The trenched field region 103 may extend below dashed line 113 to tip 111. Lower portion 104 of the trenched field region 103 has a width that may decrease as trench 101 tapers at taper region 109. The sidewalls of trench 101 include dielectric layer 127 having a dielectric thickness that increases from the vertical sidewalls toward the taper tip 111. The trenched field region 103 may be filled with a material 108 separated from the trenched gate 126 by a dielectric layer 199, for example. Dielectric thickness 112 at the tip 111 may be greater than dielectric thickness 106 on the vertical sidewall of trench 101 adjacent to taper region 109 or dielectric thickness 110 on the tapered sidewall in taper region 109. The dielectric thickness 106 may be greater than the dielectric thickness 105 of the N-MOSFET dielectric layer 116, which is vertically adjacent to and above dielectric 127. Additionally, the thickness of the dielectric layer 127 may increase along taper 109, reaching a maximum thickness at tip 111, such that dielectric thickness 110 in taper region 109 is greater than dielectric thickness 106 on the vertical sidewall of trench 101, and the dielectric thickness 112 at the tip 111 is greater than the dielectric thickness 110.

The taper 109 and the reduction in overall width of the trenched field region 103 may disperse an electric field when a reverse voltage is placed across PN junctions 117 and 118. The thickness of the dielectric layer 127 toward the tip 111 of the lower portion 104 may increase to further disperse the electric field. This may improve the ability of the power device 100 to tolerate higher voltages and not breakdown through the dielectric.

In one embodiment, material 108 may be polysilicon. In another embodiment dielectric layer 127 may be comprised of a silicon dioxide. Material 108 may be floating and may not directly couple to either P regions 121-122 or N– region 125.

In another embodiment, trenched field region 103 includes a dielectric layer within lower portion 104 having a shape that conforms to trench 101 within trench field region 103. Trench 101 may have opposing concave surfaces that meet at bottom 111 of the lower portion 104 such that trenched field region 103 tapers to disperse an electric field.

In one embodiment, the lower portion 104 may have a triangular shape. As illustrated in FIG. 1B, the bottom 111 and the tapering sides of the lower portion 104 may form an acute angle 128 and this acute angle may have a value which is less than any other other angle between any two adjacent walls of trenched field region 103. For example, FIG. 1B illustrates trenched field region 103 of FIG. 1A. Angle 128 between side walls 129 and 130 is an acute angle. Angle 128 has a value less than the value of angle 131 between side walls 132 and 129. The value of angle 128 is also less than the value of angle 133 between side walls 134 and 130.

In another embodiment, dielectric layer 127 may conform to a boundary defined by the portion of the trench including trench field region 103. Material 108 may conform to dielectric layer 127 such that angle 137 between walls 135 and 136 of material 108 is greater than angle 128.

In another embodiment, the trench walls (e.g. side walls 129, 130, 132, and 134) may not be distinctly linear as illustrated here. For example, the walls of trench 101 may continuous curved surfaces. In one embodiment, trench side walls 132 and 129 and sidewalls 134 and 130 are a single curved surfaces which narrows the width of lower portion 104 as the sidewalls approach bottom 111 of trenched field region 103.

Figure 2:
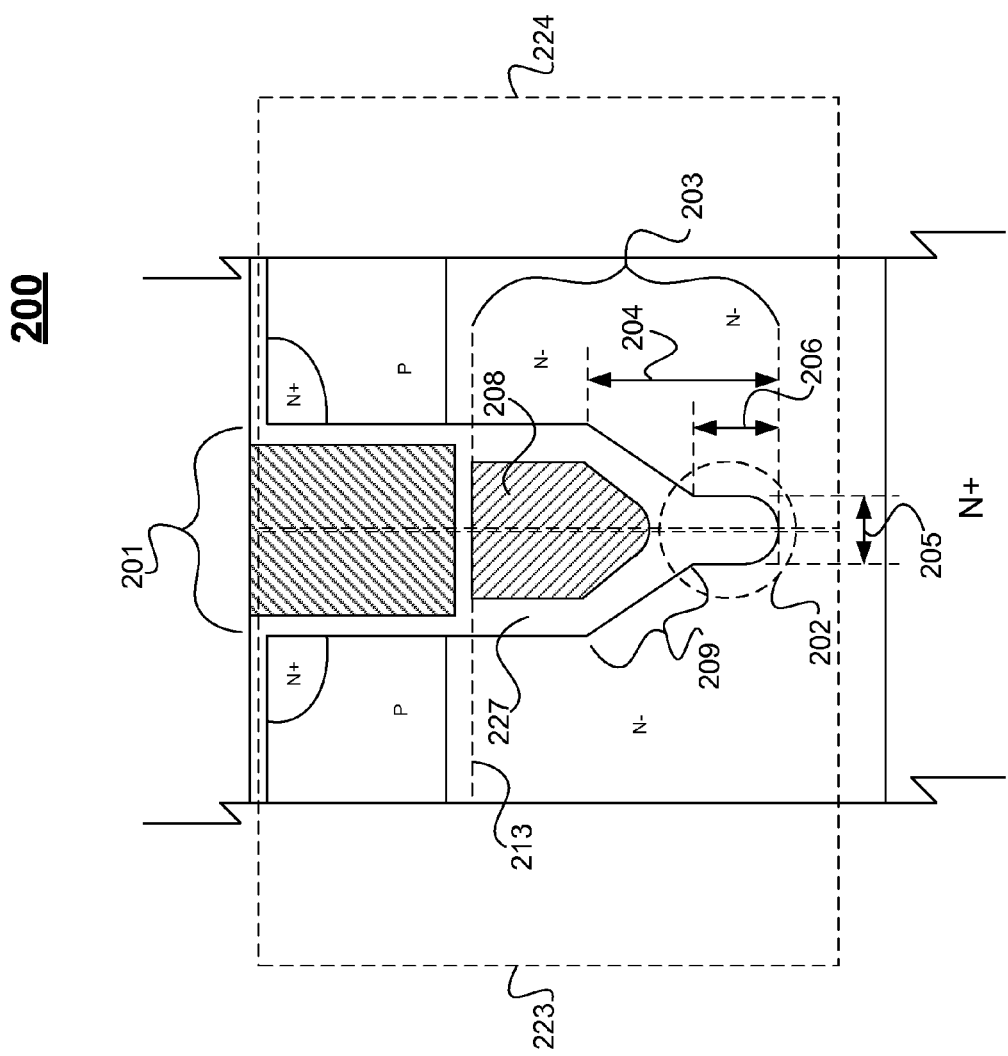
FIG. 2 illustrates a semiconductor power device according to another embodiment of the present invention.

FIG. 2 illustrates a semiconductor power device 200 according to another embodiment of the present invention. Semiconductor 200 is similar to semiconductor device 100 of FIG. 1A. Trench 201, trench field region 203, lower region 204, diode 223, diode 224, dashed line 213, dielectric layer 227, material 208, and taper region 209 correspond to trench 101, trench field region 103, lower region 104, diode 123, diode 124, dashed line 113, dielectric layer 127, material 108, and taper region 109 of FIG. 1A. Semiconductor device 200 includes a vertical elongated region 202 (e.g., a vertical elongate tip) at the bottom of lower portion 204 of the trench field region 203.

Vertical elongated region 202 may have vertical sidewalls (or substantially vertical sidewalls that taper) having a width of 205. Region 202 may have a length 206 after taper region 209. During reverse biasing of diodes 223 and 224, the electrical field may disperse around vertical elongated region 202 so that semiconductor power device 200 has a higher breakdown voltage.

Vertical elongated region 202 extends into a semiconductor epitaxial layer (e.g., N− region 125). The walls of the vertical elongated region 202 may be parallel, as shown, or may have a slight taper. The taper may be less than the taper provided in tapered region 209 so that each opposing side of vertically elongated region 202 extends further into the epitaxial layer. The width 205 of vertical extended region 202 may be less than half the width of trenched field region 203 or the width of trench 201. Lower portion 204 may include two opposing convex curved surfaces such that the length 206 is extended deeper into the epitaxial layer.

Figure 3A:
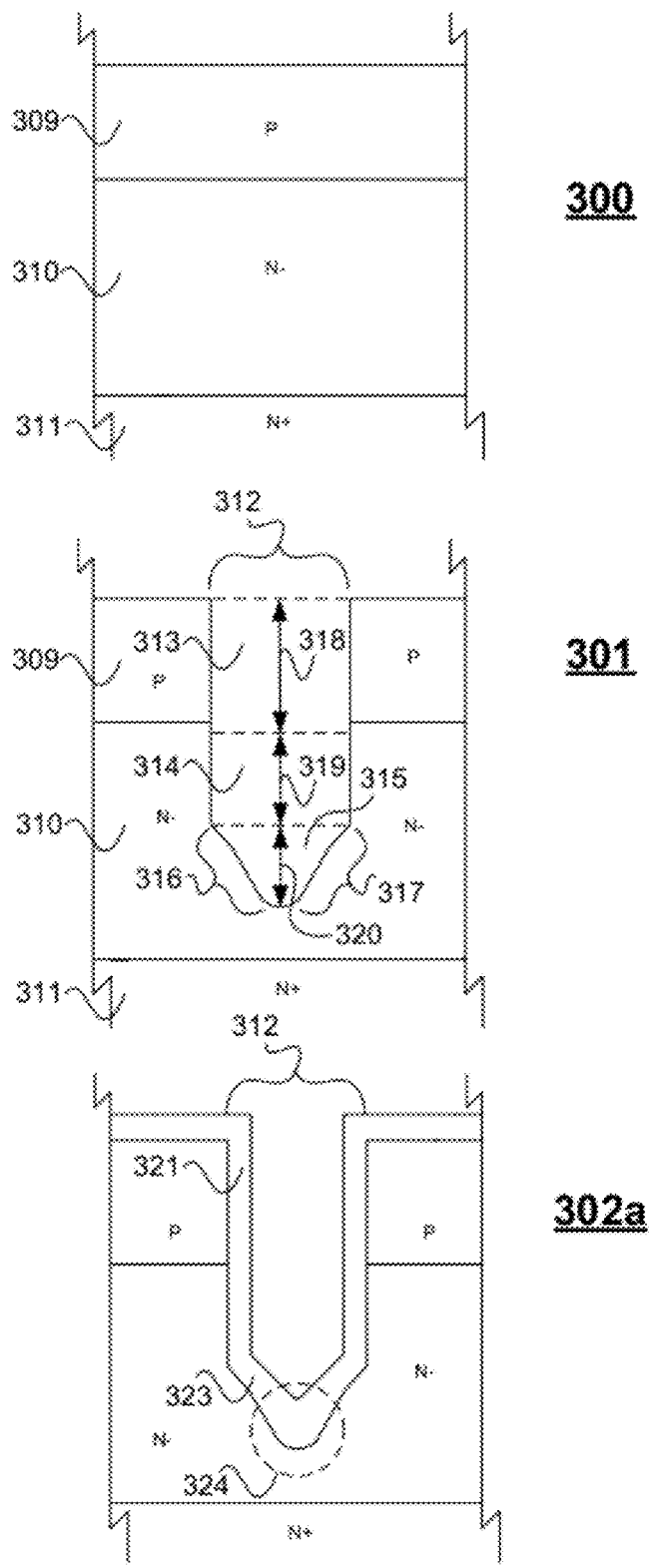
FIG. 3A-3D illustrate a method of fabricating a semiconductor power device according to one embodiment of the present invention.
Figure 3B:
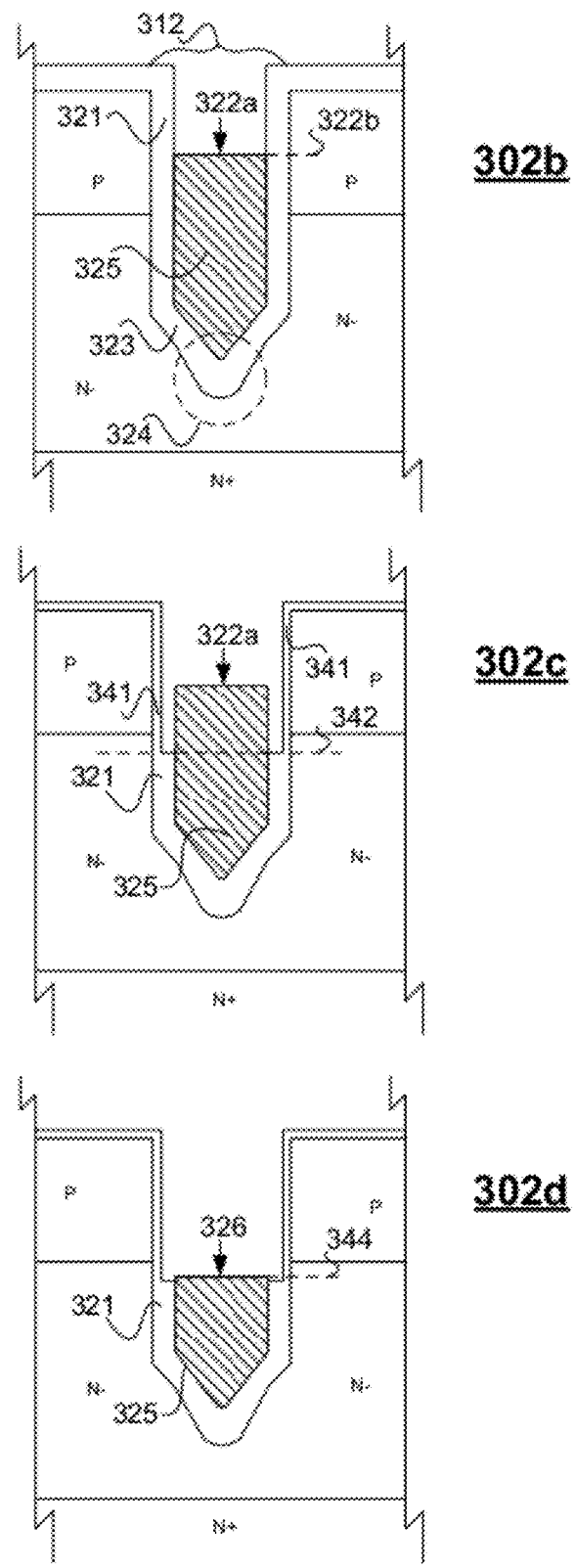
Figure 3C:
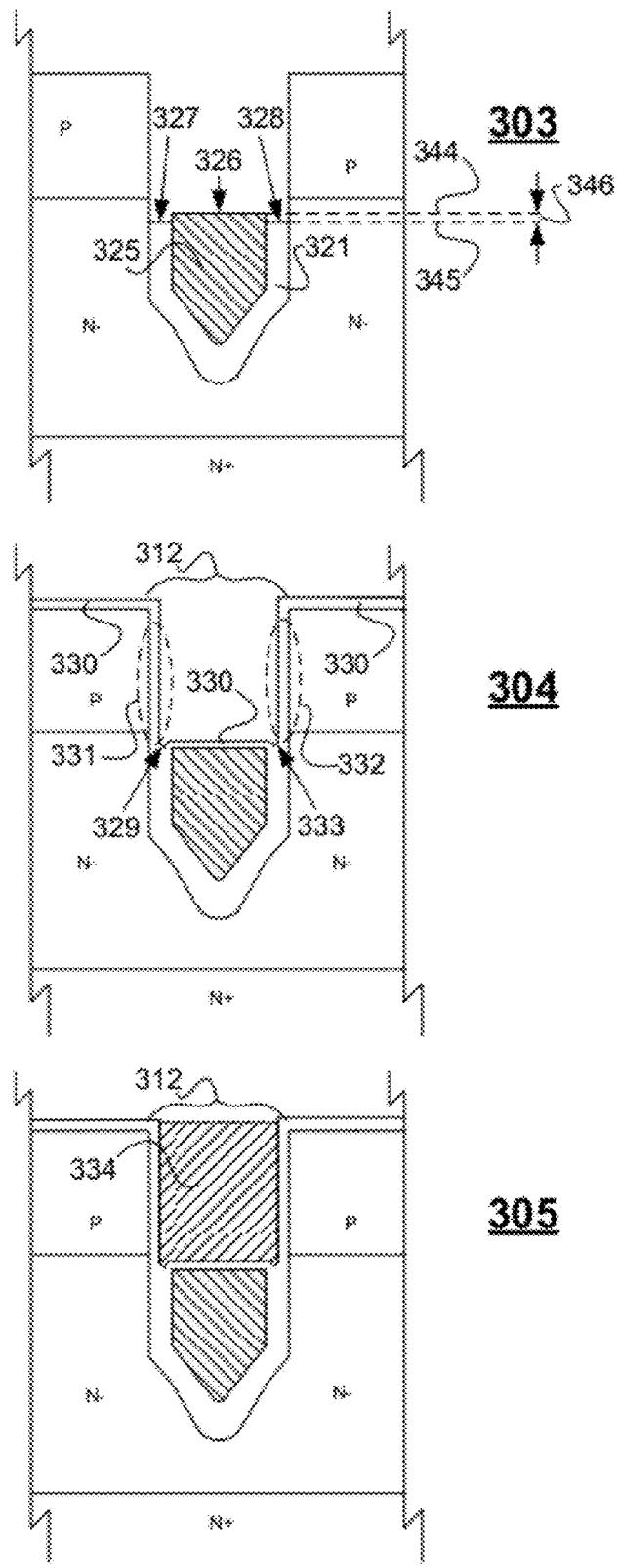
Figure 3D:
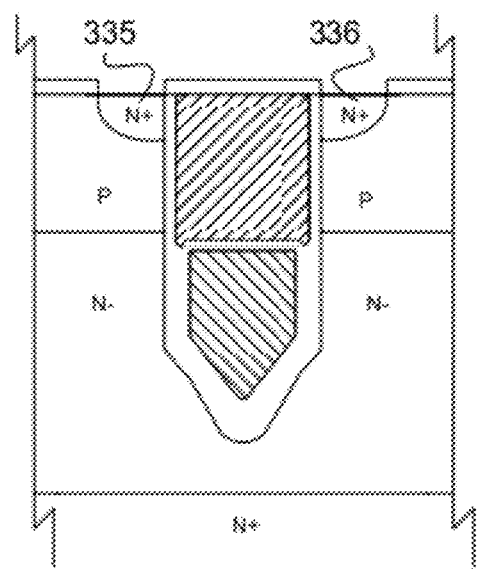
Figure 3D:
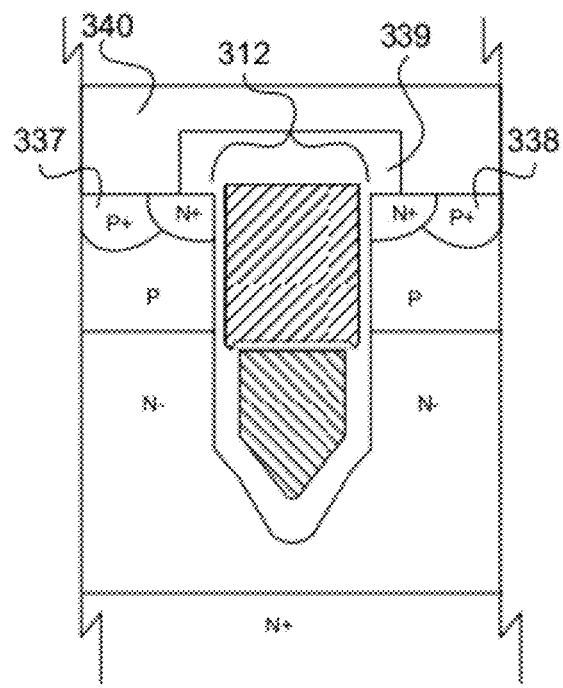

FIG. 3A-3C illustrates a method of fabricating a semiconductor power device according to one embodiment of the present invention.

At 300, a semiconductor substrate may have a N+ region 311, an epitaxial N− region 310 which has been implanted with a P body region 309.

At 301, a trench 312 may be etched into the semiconductor substrate. The etching produces an opening that defines a trenched gate area 313 a distance 318 down, an upper trench field area 314 an additional distance 319 down, and a lower trench field area 315 that extends vertically an additional distance 320. Lower trench field area 315 has a taper sidewall region 316 on one side and a taper sidewall region 317 on the other side of lower trench field area 315. In the embodiment of FIG. 2, etching the trench may include an etch step to create the vertical elongated region at a bottom of said lower portion of the trench.

At 302a, an oxide layer 321 may be grown within trench 312. Oxide layer 321 may have a greater thickness at point 323. Oxide layer 321 may also have a greater thickness at a bottom area 324. Oxide layer 321 conforms to the boundary defined by trench 312.

At 302b, polysilicon 325 may deposited within trench 312 over oxide layer 321. The depositing of polysilicon may use chemical vapor deposition (CVD). Polysilicon 325 may conform to the oxide layer 323 formed during 302a. In some embodiments, the thickness of oxide layer 323 increases toward the bottom of a lower portion of the trench 312. In this case, the walls at the bottom of the polysilicon 325 may form an angle which is greater than an angle formed by the walls at the bottom of the oxide layer 323. Polysilicon 325 may have top 322a at level 322b. In some embodiments, polysilicon 325 may be etched to have top 322a at level 322b.

At 302c, a portion of oxide layer 321 may be removed. A thinner oxide 341 may extend a depth within the trench to level 342. Level 342 may be lower than top 322a of polysilicon 325. A wet etch or dip process may be used to remove the portion of oxide layer 321, and this process may leave oxide layer 321 unchanged below level 342.

At 302d, a portion of polysilicon 325 may be removed such that top 326 of polysilicon 325 is at level 344. A poly etch process may be used to remove the portion of the polysilicon 325 to obtain a depth at level 344 for top 326.

At 303, a second portion of the oxide layer 321 may be removed such that thinner oxide 341 is removed. This may result in level 345 of top 327 and top 328 of oxide layer 321.

The difference 346 between level 344 and level 345 may be reduced to improve the reliability of the subsequent oxide added during 304 below. The polysilicon 325 masks portions of oxide layer 321 when oxide layer 321 may be etched back to level 345.

At 304, second oxide layer 330 is grown within trench 312. Areas 331 and 332 are portions of the gate oxide. Locations 329 and 333 indicate portions of second oxide 330 which have edges due to the difference 346 described in 303 above. Level 344 and 345 of 303 are close enough such that abrupt edges are reduced. This reduction of abrupt edges in second oxide layer 330 may improve reliability.

At 305, additional polysilicon 334 is deposited within the remaining area of trench 312.

At 306, N+ dopant may be implanted at regions 335 and 336.

At 307, P+ dopant may be implanted at regions 337 and 338. Also an insulating layer 339 is added. Insulating layer 339 may be a Borophosphosilicate glass (BPSG). Metal layer 340 is added to connect the anodes of the two diodes formed on either side of trench 312.

Figure 4:
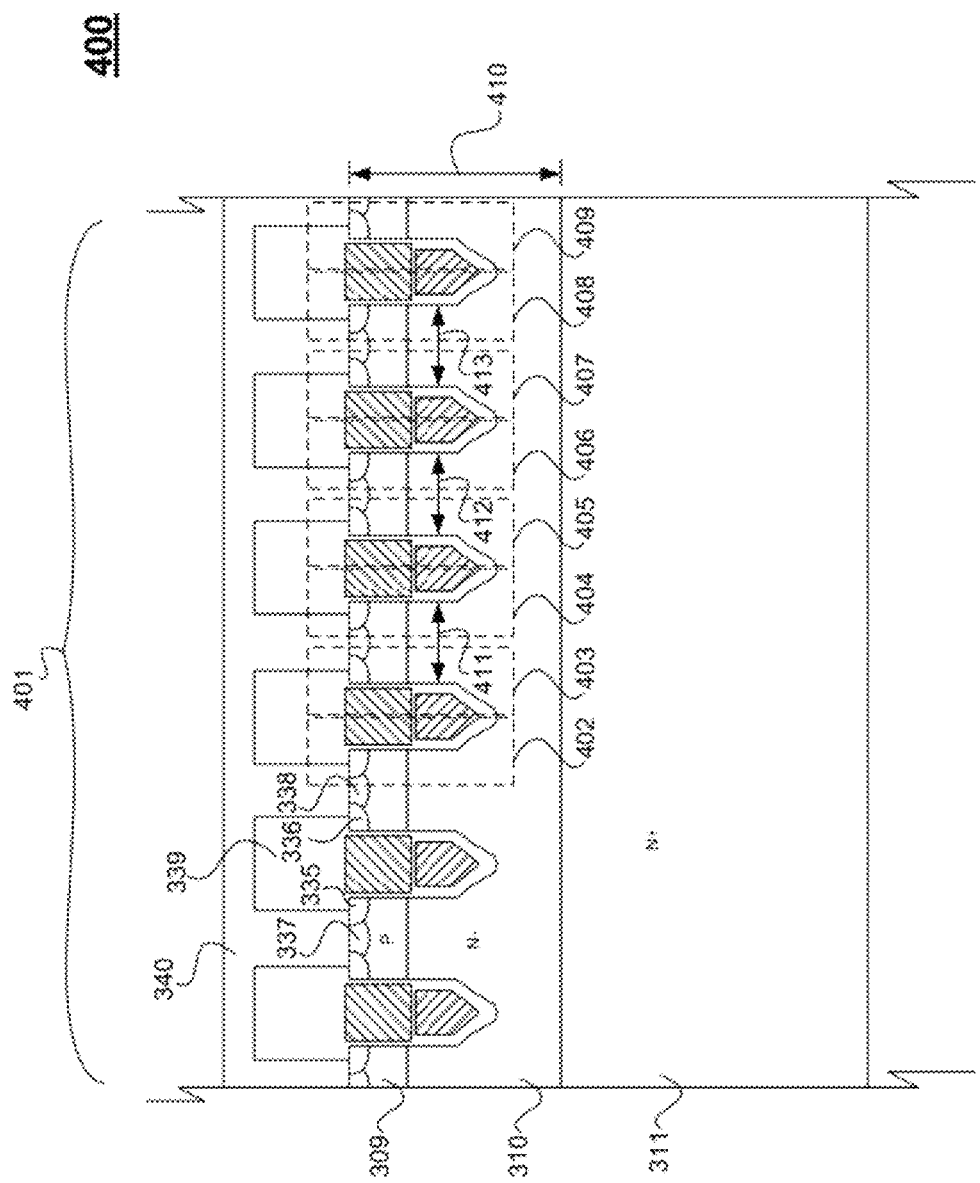
FIG. 4 illustrates an integrated circuit according to another embodiment of the present invention.

FIG. 4 illustrates an integrated circuit 400 according to another embodiment of the present invention. Integrated circuit 400 repeats an array such that a plurality of diodes (e.g. diodes 402-409) are coupled in parallel with the trenched gates coupled together. N+ region 311, epitaxial N− region 310, P body region 309, regions 335-338, insulating layer 339, and metal layer 340 may be similar to corresponding elements of FIG. 3A-3D. The plurality of diodes in parallel (e.g. diodes 402-409) may improve the current density through the power device by increasing the number of paths and cross sectional area in which current may flow from anode to cathode.

An improvement in breakdown voltage may be for a given epitaxial thickness 410. If the improvement in breakdown voltage due to the trenched field regions of the plurality of diodes (e.g. 402-409) allows for a margin of variability in this parameter, the improvement may be adjusted down by reducing the epitaxial thickness 410. The reduced epitaxial thickness 410 would maintain an acceptable breakdown voltage and may improve the $R_{DSon}$ of the MOSFET devices created by the trenched gates. In this case, the given spacing 411-413 and the reduced epitaxial layer thickness 410 allow for lower $R_{DSon}$. Additionally, the reduction in epitaxial thickness 410 may be used to improve integration by shrinking the diode structures of the semiconductor power device. In this case, the spacing of the plurality of diodes (e.g. 402-409) may be decreased such that $R_{DSon}$ is increased and the integration is improved. In some designs, an improvement in breakdown allows for more flexibility in implementing other improvements.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A semiconductor power device comprising:
a trenched gate disposed vertically within a trench in a semiconductor substrate; and a trenched field region disposed vertically within said trench and below said trenched gate, wherein:

said trenched field region includes a first material and a dielectric layer, wherein the dielectric layer is between said semiconductor substrate and said first material, wherein the semiconductor substrate forms the sidewalls of the trench, and said dielectric layer is on the sidewalls of said trench, a lower portion of the sidewalls formed of slanting regions of the semiconductor substrate disperses an electric field, wherein said dielectric layer includes a solid vertical elongated column region extending below the slanting regions, and said vertical elongated column region extends below the slanting regions to further disperse said electric field.

2. The device of claim 1 wherein said dielectric layer conforms to opposing concave surfaces of said trench which meet at a bottom of said trench field region.

3. The device of claim 1 wherein at least a portion of said lower portion forms a triangular shape, and wherein a bottom of said triangular shape forms an acute angle.

4. The device of claim 1 wherein said vertical elongated column region has a width that is less than half the width of a widest portion of said trenched field region.

5. The device of claim 1 wherein said first material forms an angle at a bottom of said first material that is greater than an angle formed at a bottom of said trench.

6. The device of claim 1 wherein said dielectric layer has a thickness at a bottom of said lower portion greater than the thickness of the dielectric layer at other portions of said trench.

7. A method of manufacturing a semiconductor power device comprising:

etching a trench in a semiconductor substrate, the trench including a lower portion, which has slanting regions formed of the semiconductor substrate;

etching in said trench a vertical elongated column region below the slanting regions;

growing a dielectric layer in the trench, wherein the dielectric layer includes a taper conforming to the slanting regions and includes a solid vertical elongated column region extending below the slanting regions; and forming a vertical MOSFET on a sidewall of the trench above the lower portion.

8. The method of claim 7 wherein forming the vertical MOSFET comprises removing the dielectric layer above the lower portion of the trench and growing a gate oxide on the sidewalls of the trench.

9. The method of claim 8 wherein forming the vertical MOSFET comprises depositing polysilicon in a portion of the trench above the lower portion.

10. The method of claim 8 wherein forming the vertical MOSFET comprises implanting a dopant in the substrate at a top of said trench.

11. The method of claim 7 further comprising depositing a first material in the lower portion of the trench, wherein the dielectric layer is between the first material and the sidewall of the trench, and wherein the dielectric layer has a first thickness that increases toward a bottom of the trench.

12. The method of claim 11 further comprising:

removing a first portion of said dielectric layer in an area above said lower portion and below a top of said first material;

removing a portion of said first material such that a depth of said top of said first material is reduced to a first level;

removing a second portion of said dielectric layer such that a depth of a top of said dielectric layer is reduced to a second level; and adding a second dielectric layer covering said top of said first material and said top of said dielectric layer.

13. The method of claim 7 wherein said dielectric layer conforms to opposing concave surfaces of said trench that meet at a bottom of said trench.

14. The method of claim 7 wherein said lower portion forms a triangular shape, and wherein a bottom of said triangular shape forms an acute angle.

15. The method of claim 7 wherein said vertical elongated column region extends below the slanting regions to disperse an electric field, and wherein said vertical elongated region has a width that is less than half the width of a widest portion of said trench above said taper.

16. An integrated circuit comprising:

a plurality of diodes coupled in parallel, each diode of said plurality of diodes comprising, a trenched gate disposed vertically within a trench in a semiconductor substrate; and a trenched field region disposed vertically within said trench and below said trenched gate, wherein:

said trenched field region includes a first material and a dielectric layer, wherein the dielectric layer is between said semiconductor substrate and said first material, wherein the semiconductor substrate forms the sidewalls of the trench, and said dielectric layer is on the sidewalls of said trench, a lower portion of the sidewalls formed of slanting regions of the semiconductor substrate disperses an electric field, wherein said dielectric layer includes a solid vertical elongated column region extending below the slanting regions, and said vertical elongated column region extends below the slanting regions to further disperse said electric field.

* * * * *